(12) United States Patent
Kato

(10) Patent No.: US 7,582,168 B2
(45) Date of Patent: Sep. 1, 2009

(54) METHOD AND APPARATUS FOR CLEANING SEMICONDUCTOR WAFER

(75) Inventor: Osamu Kato, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 601 days.

(21) Appl. No.: 11/337,480

(22) Filed: Jan. 24, 2006

(65) Prior Publication Data

US 2006/0185695 A1    Aug. 24, 2006

(30) Foreign Application Priority Data

Feb. 18, 2005    (JP)    ............................. 2005-041859

(51) Int. Cl.
*B08B 3/12*    (2006.01)
*B08B 6/00*    (2006.01)

(52) U.S. Cl. .......................................... 134/1; 134/1.3

(58) Field of Classification Search ....................... None
See application file for complete search history.

(56) References Cited

U.S. PATENT DOCUMENTS 5,939,139 A * 8/1999 Fujimoto .................... 427/240
7,431,038 B2 * 10/2008 Nishikido ................... 134/95.1
2004/0007559 A1 * 1/2004 Hongo et al. ................. 216/37
2006/0196531 A1 * 9/2006 Amai et al. ................. 134/110

FOREIGN PATENT DOCUMENTS

JP    07-183265    7/1995
JP    2003-007664    1/2003

* cited by examiner

*Primary Examiner*—Duy-Vu N Deo
(74) *Attorney, Agent, or Firm*—Rabin & Berdo, PC

(57) ABSTRACT

A wafer is placed on a rotatable stage to clean an upper surface of the wafer with a cleaning liquid while the stage and wafer are rotating. A cup-shaped cover is provided over the upper surface of the wafer. A frame portion of the cover is brought into close contact with a circumferential outer edge surface region of the wafer. Therefore, the upper surface of the wafer is cleaned without causing erosion in the circumferential outer edge surface region of the wafer. The shape of the cover is not limited to the cup-shape.

9 Claims, 7 Drawing Sheets

METHOD AND APPARATUS FOR CLEANING SEMICONDUCTOR WAFER

BACKGROUND OF THE INVENTION

1. Field of the Invention

The present invention relates to a method for cleaning semiconductor wafer and an apparatus for the same, and more particularly, to a wet wafer cleaning method and apparatus for preventing semiconductor wafers from being eroded by a cleaning liquid.

2. Description of the Related Art

A typical way of cleaning the semiconductor wafer is a dip-type cleaning. In the dip-type cleaning, a plurality of wafers is transferred by a wafer transfer apparatus, using or without using a carrier cassette, to a cleaning bath and dipped in a cleaning liquid in the cleaning bath so that the wafers are simultaneously cleaned.

However, as technology migrates to the deep submicron generation, semiconductor devices are more highly integrated and their patterns are fine pitched. Accordingly, the surface of the wafer is required to be cleaned to have a higher level of cleanliness. As a wet wafer cleaning method meeting the high level of cleanliness, suggested is a sheet-type wet cleaning method in which wafers are cleaned sheet by sheet in a closed cleaning housing.

During cleaning of only an upper (front) surface of a wafer, it happens that a cleaning liquid supplied to the upper surface of the wafer wraps around a lower surface of the wafer and contaminates the lower surface of the wafer. Once the lower surface of the wafer is contaminated, a jig for handling the wafers, such as a robot hand of a scalar-type robot becomes also contaminated due to the contaminants on the lower surface of the wafer. Thus, other wafers are continuously contaminated by the contaminated robot handle.

Accordingly, a cleaning technology to prevent the wrap-around of a cleaning liquid is strongly needed. Several approaches to prevent the cleaning liquid wrap-around are known in the art.

For example, a wrap-around prevention technology is disclosed in Japanese Patent Application Kokai (Laid-Open) No. 7-183265 (paragraph 0023 and FIG. 2). The disclosed method simultaneously cleans upper and lower surfaces of a wafer at a time to prevent the wrap-around of the cleaning liquid. In more detail, while a wafer chuck holds an outer edge (periphery) portion of the wafer, a cleaning liquid is supplied to the upper and lower surfaces of the wafer from nozzles disposed above and under the wafer, respectively. Then, the cleaning liquid spreads out on the upper and lower surfaces of the wafer in a direction from the center to an outer edge portion of the wafer and further from the edge portion to the outside (atmosphere), by the centrifugal force generated upon the rotation of the wafer. Accordingly, wrap-around of the cleaning liquid is prevented.

Another wrap-around prevention technology is disclosed in Japanese Patent Application Kokai No. 2003-7664 (paragraph 0055, FIGS. 2 and 6). Pure water is sprayed to a lower surface of a wafer from a lower nozzle disposed under the wafer while a cleaning liquid is supplied onto an upper surface of the wafer from a supply nozzle disposed above the wafer to prevent the cleaning liquid supplied to the upper surface of the wafer from flowing to the lower surface. The cleaning liquid supplied onto the upper surface of the wafer flows from a center portion of the wafer to a circumferential edge portion of the wafer along the upper surface of the wafer by a centrifugal force generated due to the rotation of the wafer, and the pure water supplied to the lower surface of the wafer also flows from a center portion of the wafer toward the circumferential edge portion of the wafer along the lower surface by the centrifugal force. Accordingly, movement of the cleaning liquid to wrap-around the lower surface of the wafer is stopped by the pure water on the lower surface. The pure water on the lower surface of the wafer serves as the sealing against the cleaning liquid.

In principle, the above described two conventional wrap-around prevention methods can prevent the cleaning liquid from flowing to the lower surface of the wafer. In reality, however, whether the wrap-around of the cleaning liquid is prevented or not depends upon a revolution speed (rpm) of the wafer and a viscosity of the cleaning liquid. If the wafer rotates at a high speed and a viscosity of the cleaning liquid is low, the cleaning liquid flies off the circumference of the wafer by a centrifugal force. In this case, there may be no need to use the above described prevention method(s) to prevent the wrap-around of cleaning liquid. On the other hand, if the wafer rotates at a low speed and a viscosity of the cleaning liquid is high, one of the above described wrap-around prevention methods is needed.

In any cases above, however, a circumferential outer edge surface region of an upper surface of the wafer disposed on a stage can be eroded by a cleaning liquid. After the erosion, the circumferential outer edge of the wafer becomes sometimes tapered. Certain types of wafers would have no problems even when the outer circumferential edge region of the wafers is exposed to the cleaning liquid and thus eroded by the cleaning liquid, but other types of wafers would have problems if the outer circumferential edge portion is eroded. In the later cases, the above described two prior art methods are not satisfactory and would cause a serious problem. Accordingly, a wafer cleaning method which does not cause any damage to a circumferential outer edge surface region of the wafer is needed.

SUMMARY OF THE INVENTION

One object of the present invention is to provide an improved wet wafer cleaning method which is capable of inhibiting or restricting erosion of a circumferential outer edge surface region of a wafer by a cleaning liquid when cleaning a surface of the wafer with the cleaning liquid while the wafer is rotating.

Another object of the present invention is to provide a wet wafer cleaning apparatus which can inhibit or restrict erosion of a circumferential outer edge surface region of the wafer by a cleaning liquid when cleaning a surface of the rotating wafer with the cleaning liquid.

According to a first aspect of the present invention, a method is provided for cleaning a wafer having a cleaning surface divided into a cleaning region and a circumferential outer edge surface region defined outside the cleaning region. The wafer is placed on a rotatable stage. The method includes placing a cover over the wafer. The method also includes supplying a cleaning liquid to the cleaning surface of the wafer while at least part of the circumferential outer edge surface region of the wafer is in contact with the cover on the rotating stage, so as to clean only the cleaning region of the wafer.

In this invention, at least part of the surface region of the wafer near the circumferential outer edge is inhibited from being eroded by the cleaning liquid. If deformation of the surface region near the circumferential outer edge, which is caused by the erosion, is within an allowable range, the erosion may not cause any problems. The allowable range depends on the type of the wafer. Restricted deformation is sometimes required only in some part of the surface region near the circumferential outer edge of the wafer. Accordingly, the term "contact" means that at least part of the surface region of the wafer near the circumferential outer edge is inhibited from being eroded by the cleaning liquid. Here, the "inhibited from being eroded" means that an amount of erosion is reduced as compared to the conventional cleaning methods. If deformation should not be created by the erosion at all in the outer edge surface area of the wafer, it is preferable that at least part of the outer edge surface region is brought into close (tight) contact with the cover and only the cleaning region is cleaned. The "close contact" or "tight contact" means that at least part of the outer edge surface region of the wafer is prevented from being eroded. If deformation due to erosion should not permitted on the entire outer edge surface area of the wafer, then it is preferable that the cleaning region is cleaned while the entire outer edge surface region of the wafer is brought into close contact with the cover.

Typically, the wafer on the rotating stage is cleaned with the cleaning liquid when the outer edge surface region of the wafer is maintained in close contact with the cover. Accordingly, the cleaning liquid spread outward in the radial direction of the wafer by a centrifugal force generated due to rotation of the stage reaches a border between the outer edge surface region and the cleaning region but does not reach (does not squeeze into) the outer edge surface region. Thus, the outer edge surface region of the wafer is not exposed to the cleaning liquid and thus not eroded.

According to a second aspect of the present invention, an apparatus is provided for cleaning a wafer having a cleaning surface divided into a cleaning region and a circumferential outer edge surface region outside the cleaning region. The apparatus includes a rotatable stage to support a wafer thereon. The apparatus also includes a cleaning liquid supply nozzle for supplying a cleaning liquid onto the cleaning surface of the wafer. The apparatus also includes a cover placed over the wafer. The cover is in contact with at least part of the circumferential outer edge surface region of the wafer, thereby allowing only the cleaning region of the wafer to be cleaned with the cleaning liquid.

According to a third aspect of the present invention, another method is provided for cleaning a wafer having a cleaning surface divided into a cleaning region and a circumferential outer edge surface region outside the cleaning region. The wafer is placed on a rotatable stage. The method includes supplying a cleaning liquid onto the cleaning surface of the wafer while the stage is rotating. The method also includes suctioning the cleaning liquid from at least part of the circumferential outer edge surface region of the wafer, so as to allow substantially only the cleaning region of the wafer to be cleaned.

Substantially only the cleaning region is cleaned because the cleaning liquid is suctioned from at least part of the outer edge surface region of the wafer. Thus, erosion by the cleaning liquid is inhibited in the outer edge surface region of the wafer.

The "suctioning the cleaning liquid" means that at least part of the outer edge surface area of the wafer is inhibited from erosion. The "inhibited from erosion" means that an amount of erosion is reduced, as compared to the conventional cleaning methods, as a result of suctioning the cleaning liquid. If only a certain part of the outer edge surface area should not be deformed by the erosion, the "suctioning the cleaning liquid" means that that part of the surface region is prevented from being eroded. If deformation by the erosion is never permitted in the entire outer edge surface region of the wafer, then it is preferable that the suction is performed right above the entire outer edge surface region of the wafer.

Typically, the wafer on the rotating stage is cleaned with the cleaning liquid while the cleaning liquid is suctioned upward from the outer edge surface region of the wafer. Accordingly, the cleaning liquid spread outward in the radial direction of the wafer by a centrifugal force generated due to rotation of the stage reaches the border between the outer edge surface region and the cleaning region but does not reach the outer edge surface region. Thus, the outer edge surface region is not eroded by the cleaning liquid.

According to a fourth aspect of the present invention, another apparatus is provided for cleaning a wafer having a cleaning surface divided into a cleaning region and a circumferential outer edge surface region outside the cleaning region. The apparatus includes a rotatable stage for supporting a wafer thereon. The apparatus also includes a cleaning liquid supply nozzle for supplying a cleaning liquid onto the cleaning surface of the wafer. The apparatus also includes a suction nozzle connected to a suction device and disposed immediately above the circumferential outer edge surface region of the wafer. The suction nozzle suctions the cleaning liquid from at least part of the circumferential outer edge surface region. Thus, the cleaning liquid is allowed to clean the cleaning region only.

BRIEF DESCRIPTION OF THE DRAWINGS

The above described and other objects, aspects and advantages of the prevent invention will become apparent and more readily appreciated from the following description of the exemplary embodiments and claims, taken in conjunction with the accompanied drawings, in which:

DETAILED DESCRIPTION OF THE INVENTION

First Embodiment

A first embodiment of the present invention will be described with reference to FIG. 1 to FIG. 5. In order to prevent a circumferential outer edge surface region of a wafer from being exposed to a cleaning liquid, a cover is provided to be in close contact with the circumferential outer edge surface region of the wafer. The wafer is placed on a stage. A cleaning liquid is supplied onto a surface of the wafer while the stage is rotating. The contact between the cover and the wafer is maintained while the stage is rotating. Therefore, cleaning of the wafer is performed without exposing the circumferential outer edge surface region to the cleaning agent. The only requisite to the cover is to be able to be in close contact with the circumferential outer edge surface region of the wafer so that the circumferential outer edge surface region of the wafer is not exposed to the cleaning liquid. Therefore, a structure of the cover is not specifically limited but a preferred example will be described below.

Figure 1:
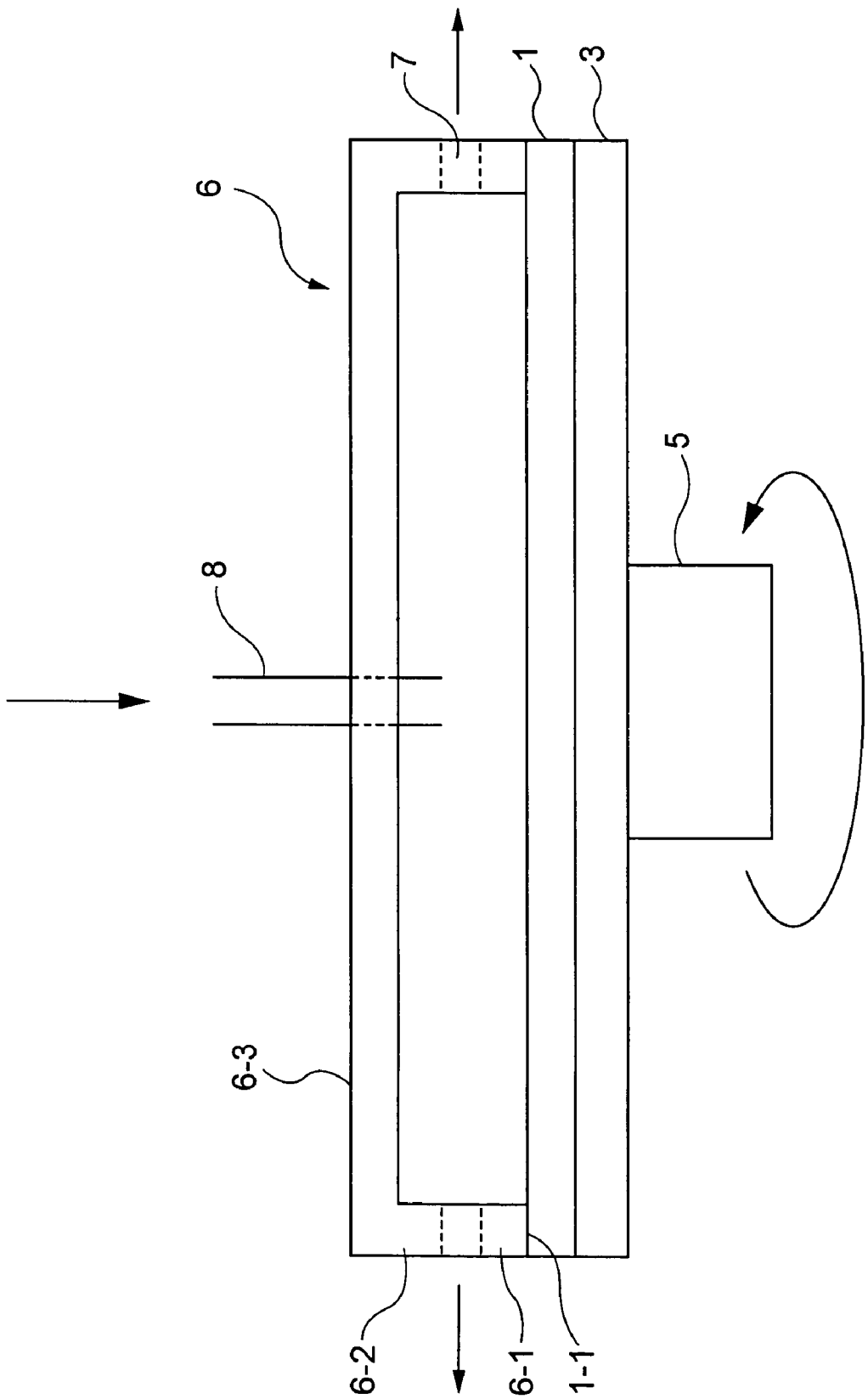
FIG. 1 is a cross-sectional view illustrating a main part of a semiconductor wafer cleaning apparatus according to a first embodiment of the present invention.
Figure 2:
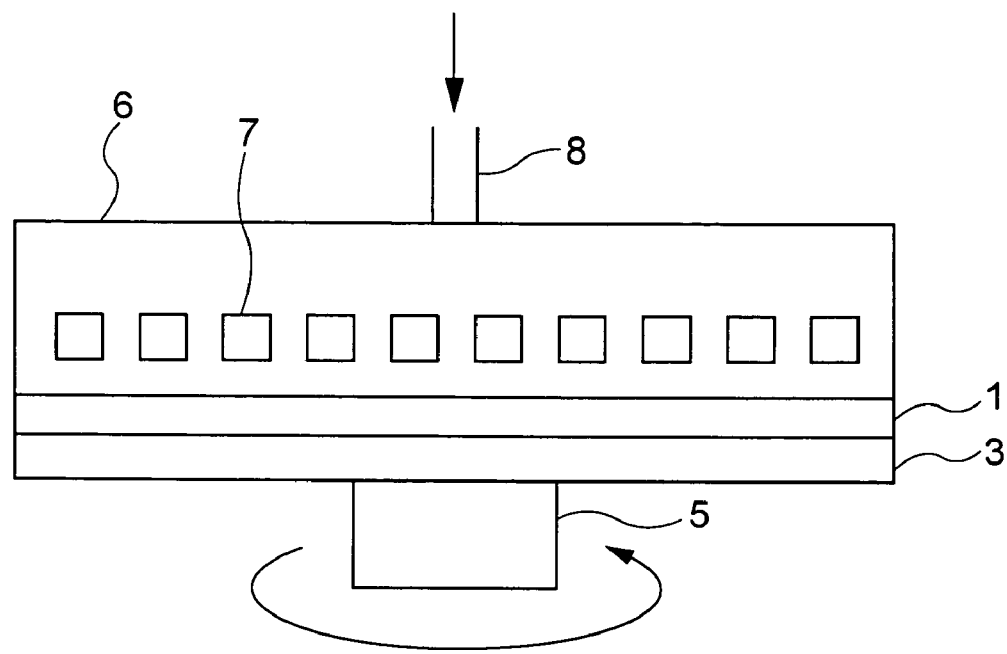
FIG. 2 is a side view illustrating the main part of the cleaning apparatus shown in FIG. 1.

FIG. 1 is a partly cross-sectional view of a stage 3 and associated elements of an apparatus for cleaning a semiconductor wafer. FIG. 2 is a front view of the stage 3 and other parts. As illustrated in FIG. 1, a wafer 1 is disposed on the stage 3 in a cleaning chamber of the cleaning apparatus. Cleaning is performed while the upper surface of the wafer 1 is covered with a cup-shaped cover 6. Thus, a circumferential outer edge surface region 1-1 of the wafer 1 is prevented from being exposed to a cleaning liquid. Accordingly, the region 1-1 of the wafer 1 is not eroded by the cleaning liquid.

The cup-shaped cover 6 has a cylinder shape having a predetermined height. A contact frame portion 6-1 of the cup-shaped cover 6 is disposed to be in close contact to the surface of the wafer 1. A plurality of cleaning liquid-discharging holes 7 are formed in a side wall 6-2 of the cup-shaped cover 6 at regular intervals. A cleaning liquid supply nozzle 8 is disposed at an upper center portion of the cup-shaped cover 6. The cup-shaped cover 6 rotates with the wafer 1 while the cup-shaped cover 6 is in close contact with the wafer 1. Under these conditions, a cleaning liquid is supplied to the wafer 1 from the supply nozzle 8 to clean the upper surface of the wafer 1. The cleaning liquid from the supply nozzle 8 is dropped onto the target surface 1-3 of the wafer 1 rotating along with the stage 3 about a rotational axis 5. The cleaning liquid on the upper surface of the wafer 1 spreads outward along the upper surface of the wafer 1 in the radially outward direction of the wafer 1 by a centrifugal force generated due to the rotation of the wafer 1, so that the cleaning. surface of the wafer 1 is cleaned by the cleaning liquid.

The wafer 1 is needed to be covered by the cup-shaped cover 6 in such a manner that the circumferential contact frame portion 6-1 of the cup-shaped cover 6 is in close contact with the circumferential outer edge surface region 1-1 of the wafer 1 in order not to expose the circumferential outer edge surface region 1-1 of the wafer 1 to the cleaning liquid. This is described in more detail below.

Figure 3:
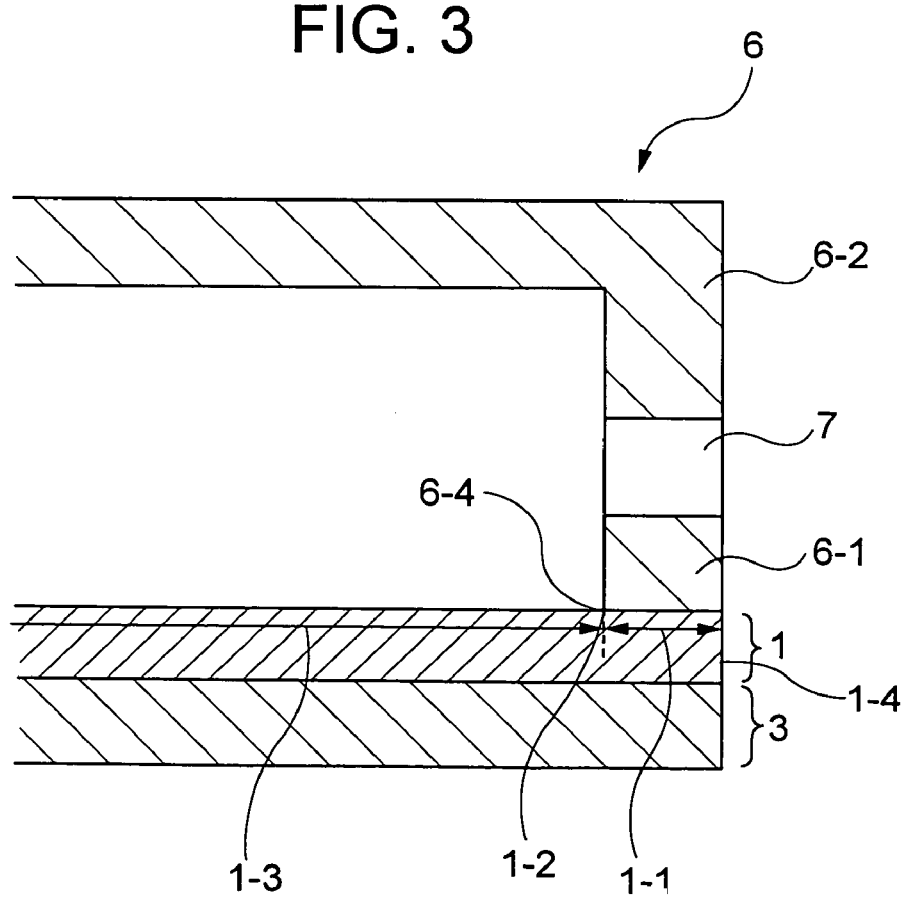
FIG. 3 is an partial enlarged sectional view illustrating a positional relationship in a radial direction of a wafer between a circumferential outer edge surface region of the wafer and a contact frame portion of a cup-shaped cover.

FIG. 3 is a cross-sectional view illustrating a positional relationship in the radial direction of the wafer 1 between the circumferential outer edge surface region 1-1 of the upper surface of the wafer 1 and the circumferential contact frame portion 6-1 of the cup-shaped cover 6. As illustrated in FIG. 3, an inner end 6-4 of the contact frame portion 6-1 of the cover 6 is aligned with a border 1-2 between the circumferential outer edge surface region 1-1 of the wafer 1 and an inner (to-be-cleaned) region 1-3 of the wafer 1. Accordingly, the cleaning liquid spread in the radial direction of the wafer 1 by a centrifugal force reaches the border 1-2 between the circumferential outer edge surface region 1-1 and the cleaning region 1-3 of the wafer 1 but does not reach the circumferential outer edge surface region 1-1 of the wafer 1 because the cleaning liquid is stopped by a circumferential wall 6-2 of the cup-shaped cover 6. The cleaning liquid is discharged from the holes 7 of the circumferential wall 6-2 of the cover 6 by a centrifugal force. In this way, the circumferential outer edge surface region 1-1 of the wafer 1 is not exposed to the cleaning liquid due to the cup-shaped cover 6 and thus not eroded.

A width of the circumferential outer edge surface region 1-1 of the wafer 1, that is, a distance from a circumferential outer edge of the wafer 1 to the border 1-2 on the upper surface of the wafer 1, is determined depending on the relationship with the cleaning region 1-3. A plane size of the cover 6 is determined such that the inner end 6-4 of the circumferential wall 6-2 of the cover 6 is matched with the border 1-2 between the circumferential outer edge surface region 1-1 and the cleaning region 1-3 of the wafer 1. Accordingly, a thickness of the circumferential wall 6-2 of the cover 6 is about the same as the width of the circumferential outer edge surface region 1-1 of the wafer 1, and the cover 6 is designed such that the plane size of the cover 6 is about the same as a plane size of the wafer 1.

The thickness of the circumferential wall 6-2 of the cover 6 can be larger than the width of the circumferential outer edge surface region 1-1 of the wafer 1 as long as the inner end 6-4 of the circumferential wall 6-2 of the cover 6 is aligned with the border 1-2 between the cleaning region 1-3 and the circumferential outer edge surface region 1-1 of the wafer 1. In this case, the plane size of the cover 6 should be larger than a diameter of the wafer 1 by an amount corresponding two times difference between the thickness of the circumferential wall 6-2 of the cover 6 and the width of the circumferential outer edge surface region 1-1 of the wafer 1. The inner end 6-4 of the circumferential wall 6-2 should not be over the pattern on the wafer 1.

As illustrated in FIG. 2, a plurality of the cleaning liquid-discharging holes 7 is arranged in series in the side wall 6-2 of the cover 6. The holes 7 are spaced apart in the circumferential direction of the cover 6. A size and shape of each discharge hole 7 and a distance between adjacent discharge holes 7 are determined so that the cleaning liquid is effectively (smoothly) discharged through the discharge holes 7, taking into account a rotational speed of the stage 3 and a viscosity of the cleaning liquid. The regular interval of the discharging holes 7 makes the cleaning liquid be discharged uniformly. It should be noted that the shape of the discharging hole 7 is a square in the illustrated embodiment, but the shape is not limited thereto. For example, the discharging hole 7 can have a slit shape, a rectangular shape, a circular shape or an oval shape as long as the shape does not negatively affect uniform discharge of the cleaning liquid. In order to increase the discharge efficiency of the cleaning liquid, the shape of the discharging hole 7 preferably has a horizontal elongated shape and the distance between adjacent discharging holes 7 should be as small as possible. The increased horizontal size of the discharging hole 7 and the decreased distance between the discharge holes 7 are desirable if only the cleaning liquid discharge efficiency is considered, but may not be desirable if the mechanical strength of the cover 6 in the vertical (height) direction of the cover 6 is considered. In practice, therefore, the shape, size and intervals of the discharge holes 7 are determined depending on the cleaning liquid discharge efficiency, the strength of the cover 6, the revolution speed (rpm) of the wafer 1 and the viscosity of the cleaning liquid.

The cleaning liquid-discharging openings 7 may linearly penetrate the circumferential wall 6-2 of the cover 6. For example, the discharge openings 7 may extend in the radial direction of the cover. It is preferred, however, that the discharge openings 7 extend spirally or slantly because the cleaning liquid on the cleaning surface of the wafer 1 rotates with the wafer 1. The cleaning liquid does not flow straight outward in the radial direction of the wafer 1 but flows helically outward from the center to the outer edge of the wafer 1.

Accordingly, the discharge openings 7 may be arranged to have a predetermined angle with respect to the radial direction of the wafer 1 so that the direction of the discharge openings 7 are in accordance with the flowing direction of the cleaning liquid near the edge of the wafer 1.

Whether the cleaning liquid discharged from the holes 7 flies off the cover 6 or drops along the outer surface of the circumferential wall 6-2 of the cover 6 depends on the viscosity of the cleaning liquid and the revolution speed of the stage 3. In general, if the viscosity of the cleaning liquid is high and the stage 3 rotates at a low rotation speed, the cleaning liquid discharged from the holes 7 probably flows (drops) along the outer surface of the circumferential wall 6-2 of the cover 6. In this instance, the circumferential edge 1-4 of the wafer 1 is exposed to the cleaning liquid, but the circumferential outer edge surface 1-1 of the wafer 1 is not exposed to the cleaning liquid because the circumferential outer edge surface 1-1 is protected by the cover 6. Accordingly, the problem encountered in the prior art wafer cleaning methods would not occur.

Since a position (level) of the discharging holes 7 is higher than the contact portion 6-1 of the cover 6, the cleaning liquid is not discharged but stays on the wafer 1 in the cleaning region 1-3 when a level of the cleaning liquid is lower than that of the discharging holes 7 during a cleaning process. After the cleaning process, the cleaning liquid accumulated in the cleaning region 1-3 of the wafer 1 is washed away by pure water.

In order to make the frame portion 6-1 of the cover 6 be in close contact with the circumferential outer edge surface region 1-1 of the wafer 1, the cover 6 is pushed downward with a pressure or the stage 3 having the wafer 1 thereon being pushed upward. If the stage 3 is designed so as to be able to move vertically, the stage 3 is moved upward after the wafer 1 is disposed on the stage 3 so that the frame portion 6-1 of the cover 6 becomes in close contact with the circumferential outer edge surface region 1-1 of the wafer 1. In this case, the cover 6 is fixed in the vertical direction but rotatable about the rotational shaft of the stage 3. Detailed structure to implement such mechanism will be described below with reference to FIG. 4 and FIG. 5.

Figure 4:
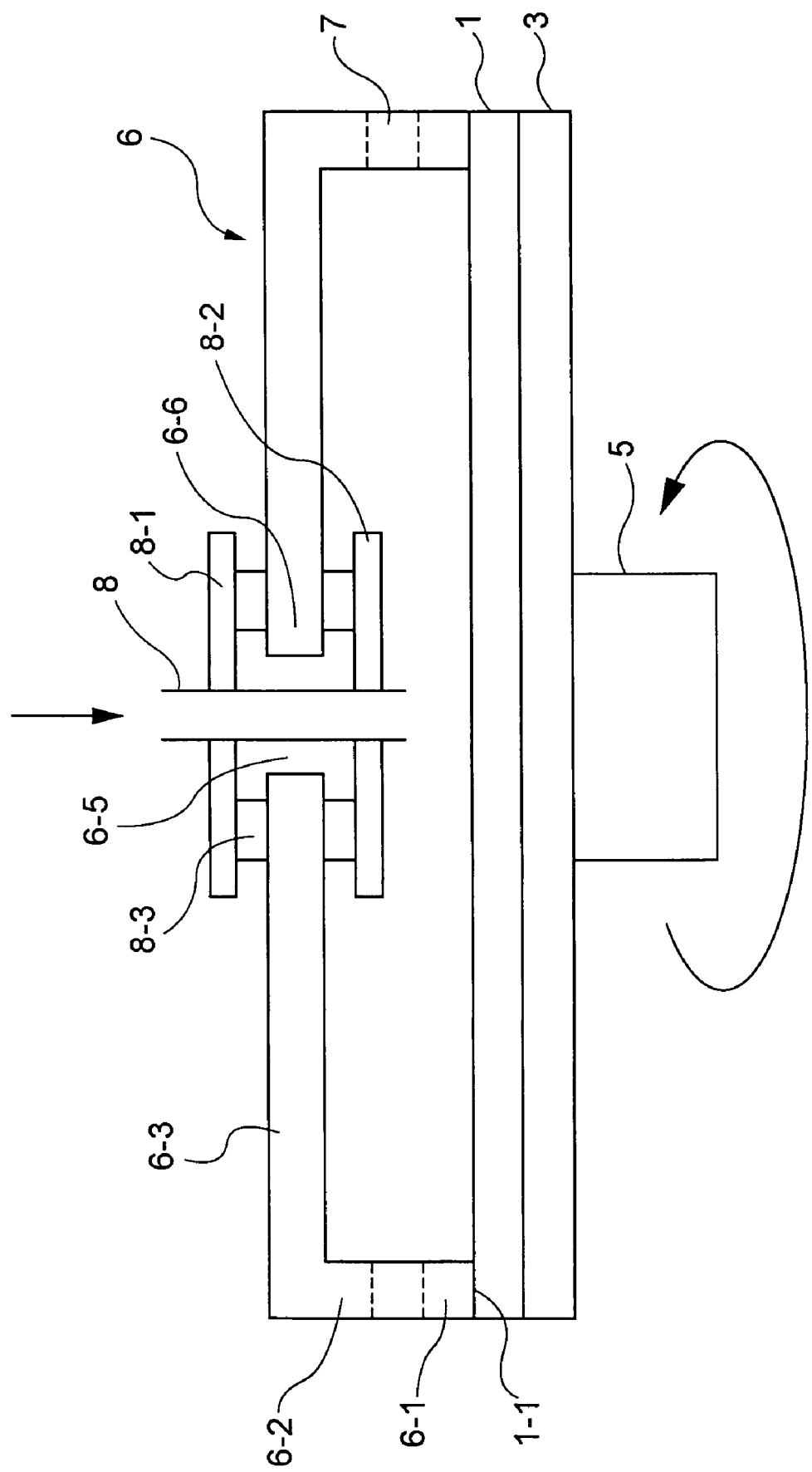
FIG. 4 is a cross-sectional view illustrating one example of a support structure for a cup-shaped cover shown in FIG. 1.

A first example is shown in FIG. 4. The cleaning liquid, supply nozzle 8 is separated from the cover 6. FIG. 4 illustrates a cross sectional view of a support structure of the cover 6. An opening 6-5 is formed in an upper part 6-3 of the cover 6, and the cleaning liquid supply nozzle 8 is disposed to pass through the upper part 6-3 of the cover 6 through the opening 6-5. The nozzle 8 is made of a material with a high rigidity, and is provided with a pair of flanges 8-1 and 8-2. A peripheral area 6-6 of the opening 6-5 formed in the upper wall 6-3 of the cover 6 is sandwiched between the upper and lower flanges 8-1 and 8-2. A rotational support mechanism 8-3 including a bearing mechanism or an antifriction (lubrication) agent such as silicon grease is provided between the peripheral area 6-6 and each of the flanges 8-1 and 8-2. Due to the rotational support mechanism 8-3 or the lubrication agent, the cover 6 is not able to move in the vertical direction but can rotate about the rotational shaft of the stage 3. It should be noted that in reality a certain gap is provided between each of the flanges 8-1 and 8-2 and the peripheral area 6-6 so that the cover 6 is freely rotational.

The cover 6 is fixed in the vertical direction and the stage 3 is pushed upward so that the contact frame portion 6-1 of the cover 6 is brought into close contact with the circumferential outer edge surface region 1-1 of the wafer 1. As a result, a frictional force is generated between the contact portion 6-1 and the surface region 1-1 when the stage 3 rotates. Upon rotation of the stage 3, the cover 6 is passively rotated along with the wafer 1 on the stage 3 by the frictional force.

Figure 5:
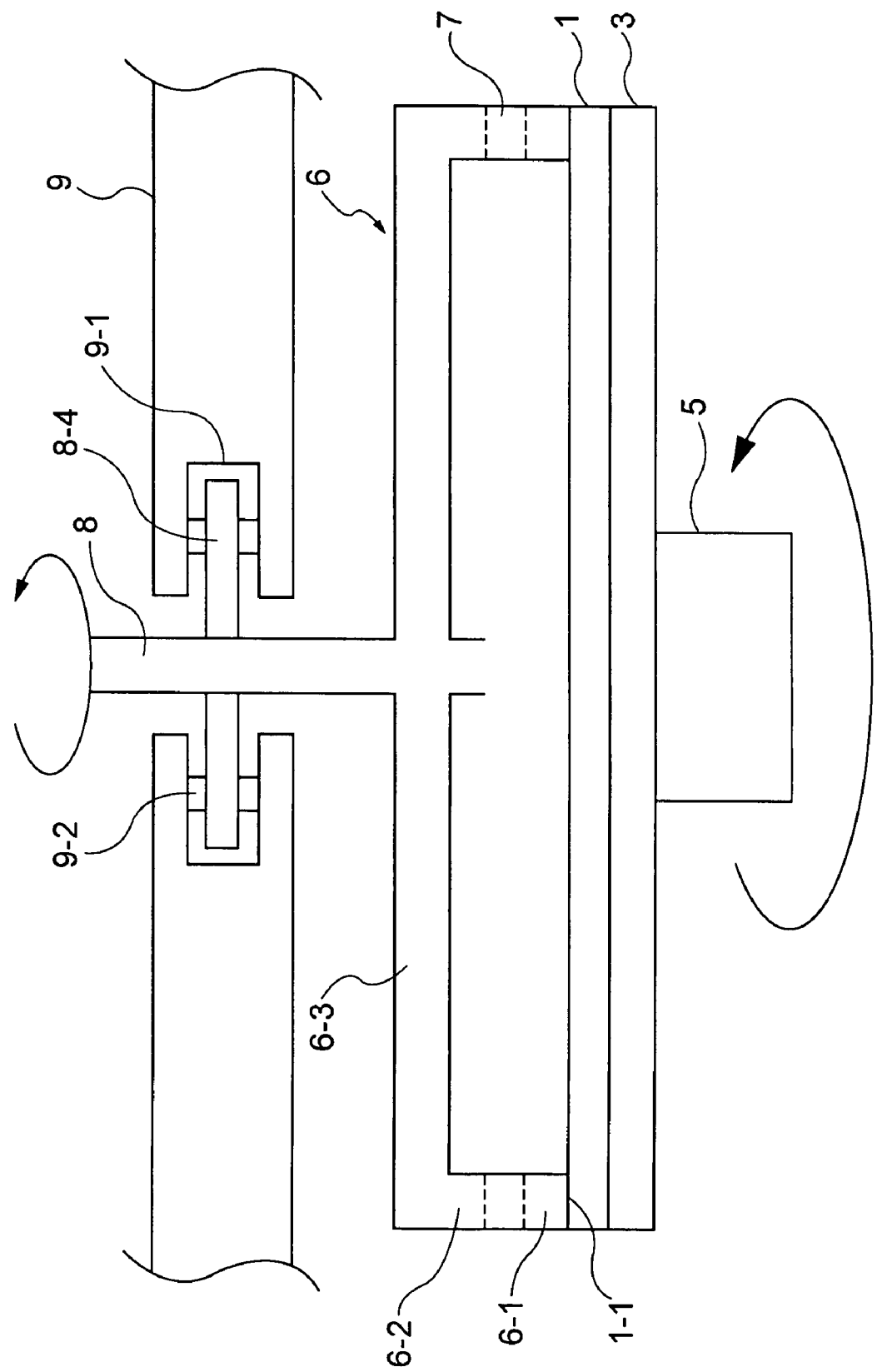
FIG. 5 is a cross-sectional view illustrating another example of the cover supporting structure.

A second example is shown in FIG. 5. The cleaning liquid supply nozzle 8 and the cover 6 are integrated into a single body. FIG. 5 illustrates a cross-sectional view of a support structure of the cover 6 in this example. The top wall 6-3 of the cover 6 is fixed to the cleaning liquid supply nozzle 8 or the top wall 6-3 and nozzle 8 are made as a single body. The cleaning liquid supply nozzle 8 has a flange 8-4. A support member 9 having a groove 9-1 which engages with the flange 8-4 is provided. The support member 9 is fixedly attached to an inner wall of a cleaning chamber (not shown). A rotational support mechanism 9-2 represented by a bearing can be installed between the flange 8-4 and the groove 9-1, or an antifriction agent such as silicon grease is introduced into a gap between the flange 8-4 and the groove 9-1. Due to the rotational support mechanism 9-2 or the antifriction agent, the cover 6 for preventing wrap-around of the cleaning liquid is fixed in the vertical direction but is freely rotational about the rotational shaft of the stage 3.

The cover 6 is fixed in the vertical direction by the support member 9, flange 8-4 and rotation support member 9-2, and the stage 3 is pushed upward against the cover 6. Thus, the frame portion 6-1 of the cover 6 comes into close contact with the circumferential outer edge surface region 1-1 of the wafer 1. As a result, a frictional force is generated between the frame portion 6-1 and the surface region 1-1 when the stage 3 rotates. Upon rotation of the stage 3, the cover 6 is passively rotated along with the wafer 1 on the stage 3 by the frictional force.

The stage 3 is moved in the vertical direction and the cover 6 is fixed in the above described example, but it should be noted that the stage 3 may be fixed and the cover 6 may be moved in the vertical direction.

The cover 6 is passively rotated by a frictional force with the wafer 1 in the illustrated example, but the cover 6 can be actively rotated in synchronization with the rotation of the stage 3. For example, a single motor which has two trains of power transmission mechanism is provided. One train is used for driving the cover 6 and the other for driving the stage 3 in synchronization with the cover 6.

The cover 6 is made of a resin such as PFA, which has a strong chemical resistance. The resin-made cover 6 can be easily processed and can have a light weight.

According to this embodiment, the upper surface of the wafer 1 is cleaned by the cleaning liquid supplied onto the upper surface of the wafer 1 from the supply nozzle 8 while the stage 3 is rotating and the circumferential outer edge surface region 1-1 of the wafer 1 is in close contact with the frame portion 6-1 of the cover 6.

Accordingly, the cleaning liquid spreading outward in the radial direction of the wafer 1 from the center to an outer edge of the wafer 1 by a centrifugal force generated due to the rotation of the stage 3 reaches the border 1-2 between the circumferential outer edge surface region 1-1 of the wafer 1 and the cleaning region 1-3 of the wafer 1, but the circumferential outer edge surface region 1-1 of the wafer 1 is not exposed to the cleaning liquid because the circumferential outer edge surface region 1-1 is in close contact with the cover 6. As a result, erosion of the circumferential outer edge surface region 1-1 of the wafer 1 is prevented.

Modification(s)

In the above described embodiment, the circumferential outer edge surface region 1-1 of the wafer 1 is covered by the cup-shaped cover 6 but the present invention is not limited thereto. The cover 6 may have any structure as long as it is capable of preventing at least the circumferential outer edge surface region 1-1 of the wafer 1 from being exposed to the cleaning liquid. For example, instead of the cover 6 shown in FIG. 1, a plurality of jigs such as clips may be installed along the entire circumferential edge 1-1 of the wafer 1 so that the sequence (chain) of jigs serves as the cover 6. The jigs are in close contact to the circumferential outer edge surface region 1-1 of the wafer 1 so that the circumferential outer edge surface region 1-1 of the wafer 1 is not exposed to the cleaning liquid during the cleaning process. Each jig may include a pair of half-cylinder members that are separatable into an upper half and a lower half. Further, instead of the cup-shaped cover 6, a flat cover having an annular shape may be used. The annular cover directly covers the circumferential outer edge surface region 1-1 of the wafer 1. This cover may have a flange part extending outward from the annular main body of the cover. The annular cover is fixed in the vertical direction but is supported to be rotational about the rotational shaft of the stage 3.

Second Embodiment

Figure 6:
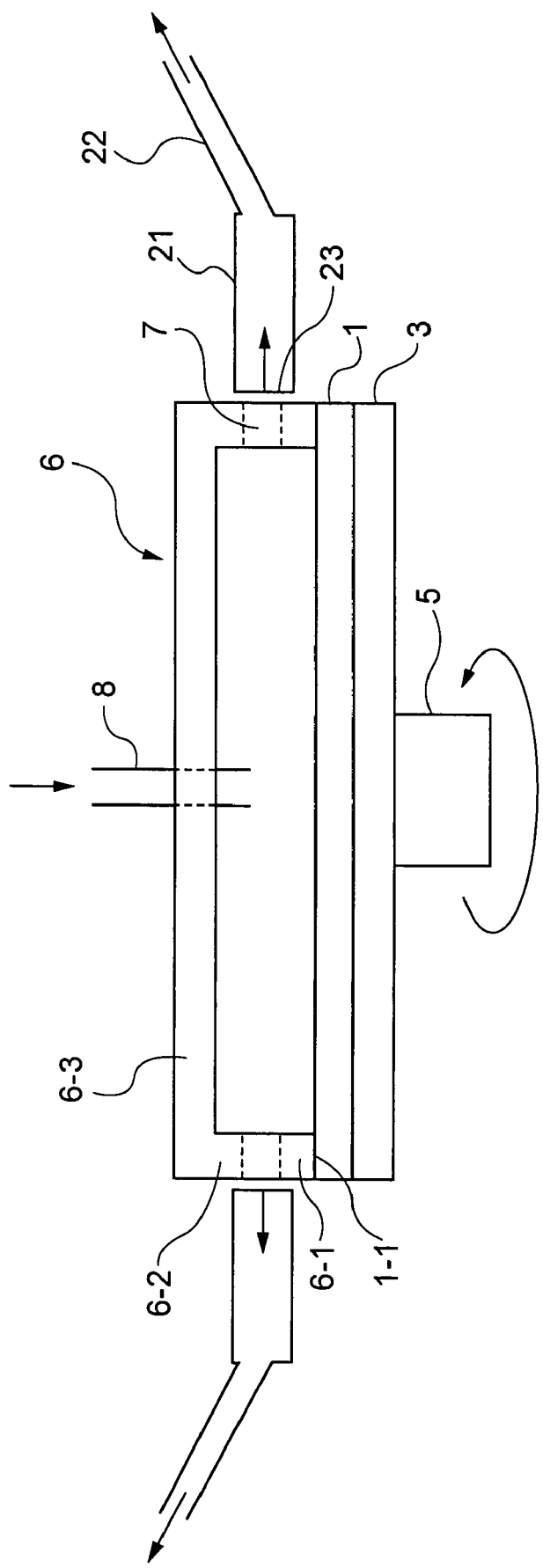
FIG. 6 is a cross-sectional view illustrating a stage and other main parts of a semiconductor wafer cleaning apparatus according to a second embodiment of the present invention.

In the first embodiment, the cleaning liquid is discharged from the openings 7 of the cover 6 using only a centrifugal force generated due to the rotation of the wafer 1. In the second embodiment, the cleaning liquid is discharged from the discharge openings 7 using a suction force from a suction device in addition to a centrifugal force so that the cleaning liquid can be discharged more effectively or quickly. FIG. 6 illustrates a sectional view of the stage 3 together with associated parts, for explaining a method for cleaning a semiconductor wafer according to a second embodiment of the present invention. Only the difference between the first and second embodiments will be described, and description of like elements and things which are already presented above will be omitted. Similar reference numerals and symbols are used in the first and second embodiments.

A suction nozzle 21 of a suction device is disposed near the discharge openings 7 of the cover 6, and the cleaning liquid is discharged from the discharge openings 7 by a centrifugal force generated due to the rotation of the wafer and a suction force applied from the suction device. The suction nozzle 21 has an annular shape and extends around the side wall 6-2 of the cover 6 such that it opens in the vicinity of the discharge openings 7. The suction nozzle 21 is connected to the suction device (not shown) via one or more suction lines 22. The suction device is installed outside a cleaning chamber, and the suction lines 22 penetrate through a wall of the cleaning chamber to connect the suction nozzle 21 inside the cleaning chamber to the suction device outside the cleaning chamber. The suction device may be a conventional vacuum device. The suction line(s) (or vacuum line(s)) 22 may be any suitable element as long as it can connect the suction nozzle 21 to the suction device. A plurality of vacuum pipes 22 may be provided around the cover 6 at regular intervals so that the cleaning liquid is sucked uniformly. The cup-shaped cover 6 rotates together with the wafer 1, but the suction nozzle 21 is fixed. Thus, preferably the single annular suction nozzle 21 is provided to face the cleaning liquid-discharging holes 7 formed along the circumferential wall 6-2 of the cover 6.

According to this embodiment, the wafer 1 is cleaned by the cleaning liquid supplied onto the upper surface of the wafer 1 from the supply nozzle 8 while the stage 3 rotates and the circumferential outer edge surface region 1-1 of the wafer 1 is in close contact with the frame portion 6-1 of the cover 6. Accordingly, the cleaning liquid spreading outward in the radial direction of the wafer 1 from the center to the outer edge of the wafer 1 by a centrifugal force generated due to the rotation of the stage 3 reaches the border 1-2 between the circumferential outer edge surface region 1-1 of the wafer 1 and the cleaning region 1-3 of the wafer 1, but does not reach the circumferential outer edge surface region 1-1 of the wafer 1 because the circumferential outer edge surface region 1-1 is in close contact with frame portion 6-1 of the cover 6. As a result, erosion of the circumferential outer edge surface region 1-1 of the wafer 1 is prevented.

The suction nozzle 21 of the suction device is disposed in the vicinity of side wall of the cover 6, particularly near the discharge holes 7. Since the cleaning liquid is discharged from the discharging holes 7 using the centrifugal force generated due to the rotation of the wafer and the suction force generated from the suction device, a discharge efficiency of the cleaning liquid is improved.

Third Embodiment

Figure 7:
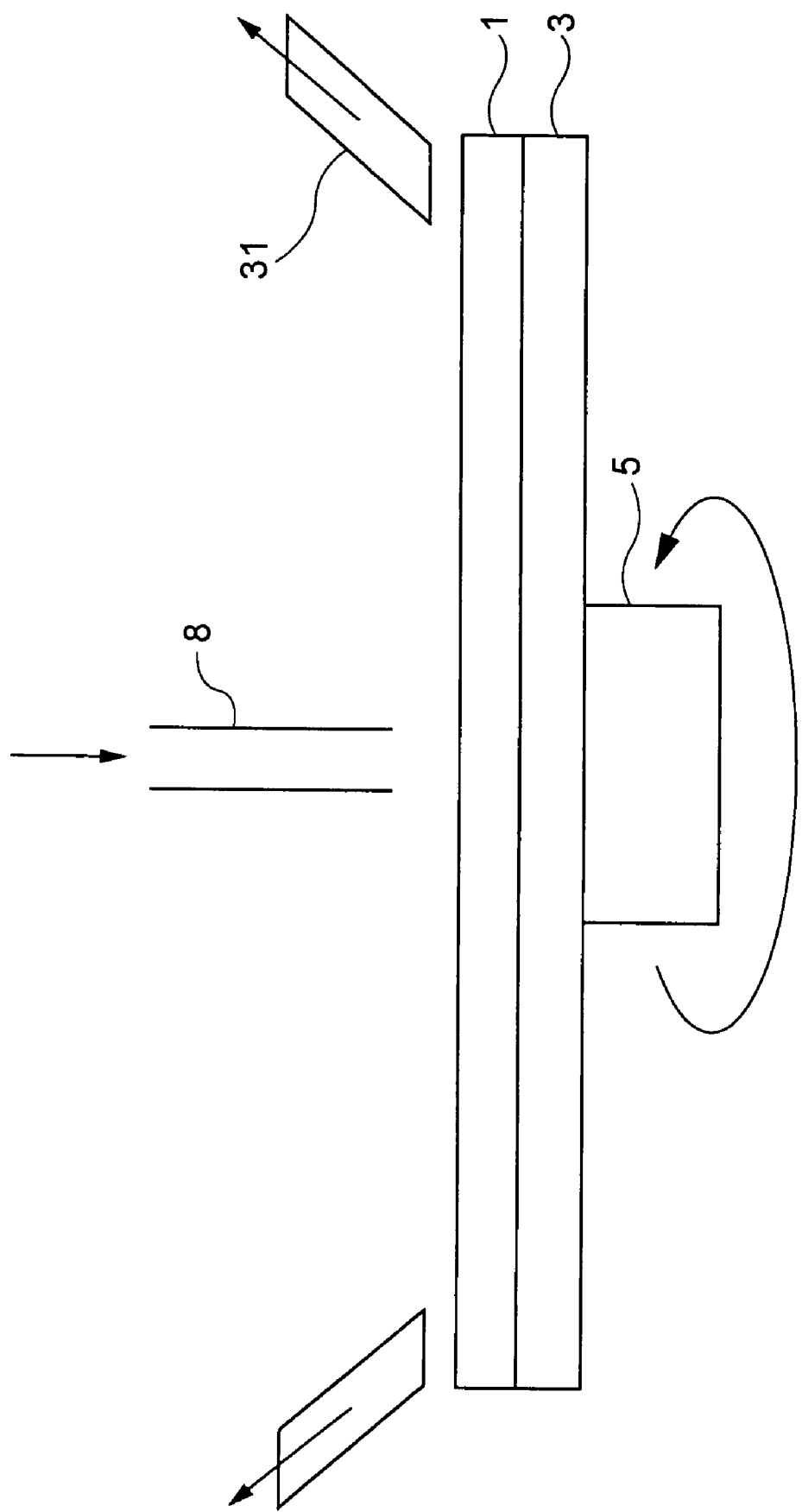
FIG. 7 is a cross-sectional view illustrating a main part of a semiconductor wafer cleaning apparatus according to a third embodiment of the present invention.
Figure 8:
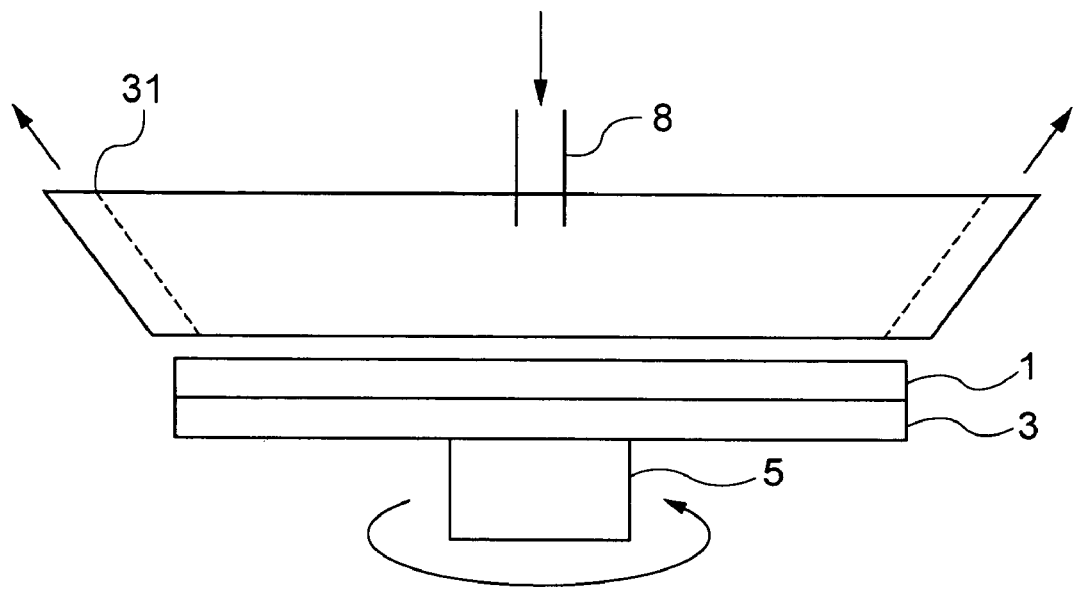
FIG. 8 is a side view illustrating the main part of the cleaning apparatus shown in FIG. 7.

The third embodiment of the present invention will be described with reference to FIG. 7 to FIG. 9. Like numerals and symbols are used in the first and third embodiments.

In the first and second embodiments, the cleaning liquid is supplied onto the top surface 1-3 of the wafer 1 while the stage 3 is rotating and the cover 6 is in close contact with the circumferential outer edge surface region 1-1 of the wafer 1, so that the cleaning is performed without exposing the circumferential outer edge surface region 1-1 of the wafer 1 to the cleaning liquid.

In the third embodiment, a suction nozzle 31 connected to a suction device (not shown) is disposed above the circumferential outer edge surface region 1-1 of the wafer 1 instead of using the cover 6. Description of only the difference between the first embodiment and this embodiment will be made below. FIG. 7 illustrates a cross sectional view of a main part of the semiconductor wafer cleaning apparatus according to the third embodiment of the present invention. FIG. 8 illustrates a side view of the main part of the cleaning apparatus shown in FIG. 7.

The cleaning liquid supplied onto the cleaning region 1-3 of the wafer 1 from the cleaning liquid supply nozzle 8 spreads outward in the radial direction of the wafer 1 by a centrifugal force generated due to the rotation of the wafer 1. As soon as or right before the cleaning liquid reaches the circumferential outer edge surface region 1-1 of the wafer 1, the cleaning liquid is suctioned by the suction nozzle 31 connected to the suction device via a suction line. Consequently, the circumferential outer edge surface region 1-1 of the wafer 1 is not exposed to the cleaning liquid, so that the erosion thereof is substantially prevented or inhibited.

Figure 9:
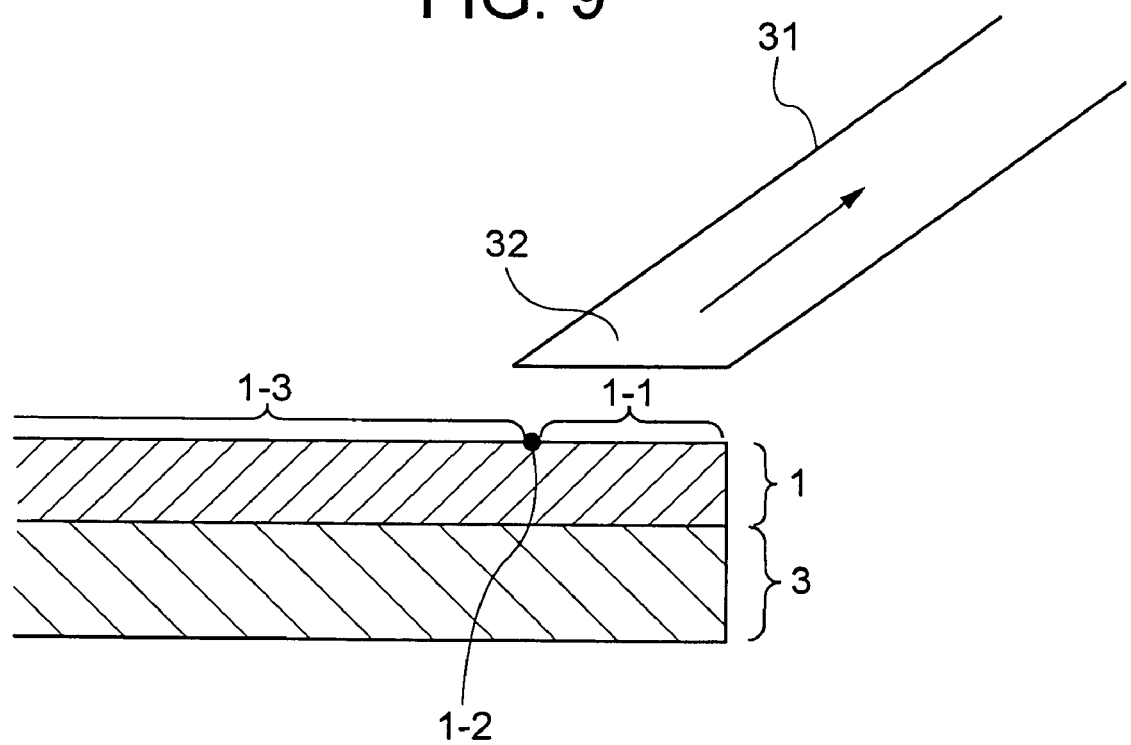
FIG. 9 is a cross-sectional view illustrating a positional relationship in the radial direction of the wafer between a circumferential outer edge surface region of the wafer and a suction nozzle.

FIG. 9 is a section view illustrating a positional relationship in the radial direction of the wafer 1 between the circumferential outer edge surface region 1-1 of the wafer 1 and the suction nozzle 31. As illustrated in FIG. 9, an opening 32 of the suction nozzle 31 is located at the same position as the circumferential outer edge surface region 1-1 of the wafer 1 in the radial direction of the wafer 1. The suction hole 32 of the suction nozzle 31 is disposed right above the circumferential outer edge surface region 1-1 of the wafer 1 in the vertical direction. From the viewpoint of the suction efficiency, a face of the suction hole 32 of the suction nozzle 31 is preferably parallel the surface 1-1 of the wafer 1. Accordingly, the cleaning liquid spread outward in the radial direction of the wafer 1 by a centrifugal force reaches the border 1-2 between the circumferential outer edge surface region 1-1 and the cleaning region 1-3 of the wafer 1, but does not reach the circumferential outer edge surface region 1-1 of the wafer 1 because the cleaning liquid is suctioned through the suction hole 32 of the suction nozzle 31 disposed above the circumferential outer edge surface region 1-1 of the wafer 1. As a result, the circumferential outer edge surface region 1-1 of the wafer 1 is not exposed to the cleaning liquid, so that erosion of the circumferential outer edge surface region 1-1 of the wafer 1 is prevented or inhibited. The cleaning liquid suctioned by the suction nozzle 31 through the suction hole 32 is discharged outside the cleaning chamber via the suction line which penetrates the wall of the cleaning chamber (not shown).

The suction nozzle 31 has an inverted truncated conical shape. The suction hole 32 of the suction nozzle 31 extends around the entire circumferential outer edge surface region 1-1 of the wafer 1. The suction device (not shown) is installed outside the cleaning chamber. The suction device may be a conventional vacuum device. The suction line may be any suitable element as long as it can connect the suction nozzle 31 to the suction device. In order to suction the cleaning liquid uniformly in the radial direction of the wafer 1, a plurality of vacuum lines extend radially outward from the suction nozzle 31 at regular intervals. Preferably the single suction hole 32 of the suction nozzle 31 extends around the wafer 1 since the suction nozzle 31 is fixed and the wafer 1 rotates.

According to this embodiment, the suction nozzle 31 connected to the suction device is disposed immediately above the circumferential outer edge surface region 1-1 of the wafer 1 instead of the cup-shaped cover. When the cleaning liquid supplied onto the cleaning region 1-3 of the wafer 1 from the nozzle 8 spreads outward in the radial direction of the wafer 1 by a centrifugal force generated due to the rotation of the wafer 1, the cleaning liquid is suctioned by the suction nozzle 31 (or suction device) right before or as soon as the cleaning liquid reaches the circumferential outer edge surface region 1-1 of the wafer 1. Therefore, the circumferential outer edge surface region 1-1 of the wafer 1 is not exposed to the cleaning liquid, and the erosion of the wafer 1 does not occur.

Although a few exemplary embodiments of the present invention have been shown and described, it will be appreciated by those skilled in the art that various changes and modifications may be made to these embodiments without departing from the principles and spirit of the invention, the scope of which is defined in the appended claims and their equivalents.

This application is based on a Japanese Patent Application No.2005-41859 filed on Feb. 18, 2005 and the entire disclosure thereof is incorporated herein by reference.

What is claimed is:

1. A method for cleaning a wafer placed on a rotatable stage and having a surface divided into a cleaning region and a circumferential outer edge surface region defined outside the cleaning region, the method comprising:

placing a cover over the wafer such that the cover is in contact with at least part of the circumferential outer edge surface region of the wafer;

rotating the stage together with the wafer; and supplying a cleaning liquid to the surface of the rotating wafer to clean the cleaning region of the wafer while the cover is in contact with the at least part of the circumferential outer edge surface region of the wafer;

wherein the at least part of the circumferential outer edge surface region is brought into close contact with the cover; and wherein the cover is an inverted cup-shaped cover having a top wall, a side wall and a contact frame portion, at least one cleaning liquid-discharging hole is formed in the side wall, and the wafer is cleaned while the contact frame portion of the cup-shaped cover is in close contact with the circumferential outer edge surface region of the wafer.

2. The method according to claim 1, wherein the at least part of the circumferential outer edge surface region of the wafer is in contact with the cover such that the at least part of the circumferential outer edge surface region is inhibited from being eroded by the cleaning liquid.

3. The method according to claim 1, wherein an entirety of the circumferential outer edge surface region is in close contact with the cover.

4. The method according to claim 1, wherein the at least part of the circumferential outer edge surface region is brought into close contact with the cover such that the at least part of the surface region of the circumferential edge portion is prevented from being eroded by the cleaning liquid.

5. The method according to claim 1, wherein an inner end of the contact frame portion of the cup-shaped cover is located on a border between the circumferential outer edge surface region and the cleaning region of the wafer.

6. The method according to claim 1, wherein a cleaning liquid supply nozzle is disposed at a center portion of the top wall of the cup-shaped cover, the cup-shaped cover is fixed in a height direction of the cover but rotatable about a rotational shaft of the stage, the stage is pushed upward so that the wafer on the stage is brought into tight contact with the cup-shaped cover, and the cup-shaped cover is rotated together with the rotating stage and wafer by a frictional force generated between the circumferential outer edge surface region of the wafer and the contact frame portion of the cup-shaped cover.

7. The method according to claim 1, wherein an opening is formed at a center portion of the top wall of the cup-shaped cover so that a cleaning liquid supply nozzle passes through the opening, the nozzle has an extended portion which engages with the center portion of the cup-shaped cover so that the cup-shaped cover is fixed in a height direction of the cover and is rotatable about a rotational shaft of the stage, the stage is pushed upward so that the wafer on the stage is brought into tight contact with the cup-shaped cover, and the cup-shaped cover is rotated together with the rotating stage and wafer by a frictional force generated between the circumferential outer edge surface region of the wafer and the contact frame portion of the cup-shaped cover.

8. The method according to claim 1, wherein a suction nozzle of a suction device is disposed adjacent to the cleaning liquid-discharging hole, and the cleaning liquid is discharged from the cleaning liquid-discharging hole by a suction force generated from the suction device and a centrifugal force generated due to the rotation of the wafer.

9. The method according to claim 8, wherein the suction nozzle continuously extends around the side wall of the cup-shaped cover, a suction hole of the suction nozzle is located at a position of the cleaning liquid-discharging hole, and the wafer is cleaned while the cleaning liquid is suctioned.

* * * * *